US010282586B2

United States Patent
Jiang et al.

(10) Patent No.: US 10,282,586 B2
(45) Date of Patent: May 7, 2019

(54) METHOD AND APPARATUS FOR REALIZING TOUCH BUTTON AND FINGERPRINT IDENTIFICATION, AND TERMINAL DEVICE USING SAME

(71) Applicant: Xiaomi Inc., Beijing (CN)

(72) Inventors: Zhongsheng Jiang, Beijing (CN); Kun Yang, Beijing (CN); Jun Tao, Beijing (CN)

(73) Assignee: Xiaomi Inc., Beijing (CN)

( * ) Notice: Subject to any disclaimer, the term of this patent is extended or adjusted under 35 U.S.C. 154(b) by 0 days.

(21) Appl. No.: 14/988,919

(22) Filed: Jan. 6, 2016

(65) Prior Publication Data
US 2016/0196466 A1   Jul. 7, 2016

(30) Foreign Application Priority Data

Jan. 7, 2015 (CN) .......................... 2015 1 0008243
Jan. 30, 2015 (CN) .......................... 2015 1 0050761

(51) Int. Cl.
*G06K 9/00* (2006.01)
*H03K 17/96* (2006.01)

(52) U.S. Cl.
CPC ....... *G06K 9/00087* (2013.01); *G06K 9/0002* (2013.01); *H03K 17/962* (2013.01)

(58) Field of Classification Search
CPC .................................................. G06K 9/0002
See application file for complete search history.

(56) References Cited

U.S. PATENT DOCUMENTS

| 4,290,052 | A | 9/1981 | Eichelberger et al. |
| 8,564,314 | B2 * | 10/2013 | Shaikh ................ G06K 9/0002 324/658 |
| 9,001,081 | B2 * | 4/2015 | Pope ...................... G06F 3/044 200/600 |
| 9,254,633 | B2 * | 2/2016 | Rao ...................... G06K 9/0002 |
| 9,501,685 | B2 * | 11/2016 | Bernstein ............. G06K 9/0002 |
| 2010/0156595 | A1 | 6/2010 | Wong et al. |
| 2013/0108124 | A1 | 5/2013 | Wickboldt et al. |
| 2014/0219520 | A1 * | 8/2014 | Myers ................ G06K 9/00087 382/124 |
| 2014/0341447 | A1 | 11/2014 | Cho et al. |

(Continued)

FOREIGN PATENT DOCUMENTS

| AU | 2013100571 A4 | 5/2013 |
| CN | 104049828 A | 9/2014 |

(Continued)

OTHER PUBLICATIONS

Office Action in counterpart Russian Application No. 2016125121/08(039330), dated Mar. 31, 2017 and English translation thereof.

(Continued)

*Primary Examiner* — Phuoc Tran
(74) *Attorney, Agent, or Firm* — Finnegan, Henderson, Farabow, Garrett & Dunner LLP

(57) ABSTRACT

An apparatus for realizing a touch button and fingerprint identification, includes: a fingerprint identification sensor, disposed below a cover glass of a touch screen of a terminal device; and a capacitive button sensor, disposed below the cover glass and located on at least one side of the fingerprint identification sensor.

6 Claims, 8 Drawing Sheets

(56) References Cited

U.S. PATENT DOCUMENTS

| | | | |
|---|---|---|---|
| 2014/0354596 A1 | 12/2014 | Djordjev et al. | |
| 2015/0036065 A1* | 2/2015 | Yousefpor | G06K 9/228 349/12 |
| 2015/0242673 A1* | 8/2015 | Singhal | G06K 9/00013 345/174 |
| 2015/0296622 A1* | 10/2015 | Jiang | G01L 1/2268 361/750 |

FOREIGN PATENT DOCUMENTS

| | | |
|---|---|---|
| CN | 204066055 U | 12/2014 |
| CN | 104537366 A | 4/2015 |
| JP | 2006086998 A | 3/2006 |
| JP | 2013541780 A | 11/2013 |
| RU | 2435195 C1 | 11/2011 |
| WO | WO 01/59558 A1 | 8/2001 |
| WO | WO 2005/024706 A1 | 3/2005 |
| WO | WO 2012/054353 A1 | 4/2012 |
| WO | WO 2014/143065 A1 | 9/2014 |
| WO | WO 2014/197243 A2 | 12/2014 |

OTHER PUBLICATIONS

Office Action in counterpart Japanese Application No. 2016-568105, dated Mar. 7, 2017 and English translation thereof.
Extended Search Report for European Application No. 16150089.7 from the European Patent Office, dated May 30, 2016.
International Search Report of PCT Application No. PCT/CN2015/093412, dated Feb. 2, 2016, issued by the ISA/CN—State Intellectual Property Office of the P.R. China.
Written Opinion of the International Searching Authority in International Application No. PCT/CN2015/093412, dated Feb. 2, 2016, issued by the ISA/CN—State Intellectual Property Office of the P.R. China.
Office Action in counterpart Chinese Application No. 201510050761.2, dated Jul. 25, 2018.

* cited by examiner

METHOD AND APPARATUS FOR REALIZING TOUCH BUTTON AND FINGERPRINT IDENTIFICATION, AND TERMINAL DEVICE USING SAME

This application is based upon and claims priority to Chinese Patent Application No. 201510050761.2, filed Jan. 30, 2015, and Chinese Patent Application No. 201510008243.4, filed Jan. 7, 2015, the entire contents of all of which are incorporated herein by reference.

TECHNICAL FIELD

The present disclosure relates to the field of terminal devices and, more particularly, to a method and an apparatus for realizing a touch button and fingerprint identification and a terminal device using the method and the apparatus.

BACKGROUND

With the increase of functions of a terminal device, more and more new functions of the terminal device bring convenience to a user.

Presently, the fingerprint identification function begins to get the favor of major terminal device manufacturers. Concerning the design of the fingerprint identification function, a traditional terminal device (such as a mobile phone, a tablet computer, etc.) basically combines the fingerprint identification function with a physical button. For example, FIG. 1 is a sectional view of a terminal device 100, according to prior art. Referring to FIG. 1, a fingerprint identification area, corresponding to a fingerprint identification sensor 103, in a cover glass 101 is required to be provided with a corresponding hole, because the fingerprint identification sensor 103 generally needs to be pressed for a certain distance to enable pressing a physical button 102. If a user touches the fingerprint identification sensor 103 softly, the terminal device 100 may only identify this action as the fingerprint identification action. If the user presses the fingerprint identification sensor 103 to reach a certain distance, the physical button 102 may be triggered, so that the terminal device 100 may identify this action as both a fingerprint identification action and a touch button action. However, the structure described above may not only affect the aesthetic appearance of the terminal device but also affect the convenience of the user's operation.

SUMMARY

According to a first aspect of the present disclosure, there is provided an apparatus for realizing a touch button and fingerprint identification, comprising: a fingerprint identification sensor, disposed below a cover glass of a touch screen of a terminal device; and a capacitive button sensor, disposed below the cover glass and located on at least one side of the fingerprint identification sensor.

According to a second aspect of the present disclosure, there is provided a terminal device, comprising: a touch screen including a cover glass; and an apparatus for realizing a touch button and fingerprint identification, wherein the apparatus includes: a fingerprint identification sensor, disposed below the cover glass; and a capacitive button sensor, disposed below the cover glass and located on at least one side of the fingerprint identification sensor.

According to a third aspect of the present disclosure, there is provided a method for realizing a touch button and fingerprint identification, comprising: receiving a touch operation performed on a preset touch area of a cover glass of a touch screen; and performing at least one of: collecting fingerprint information applied to the preset touch area, or collecting a capacitance generated on the cover glass and analyzing the capacitance to obtain a capacitance variation.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Figure 1:
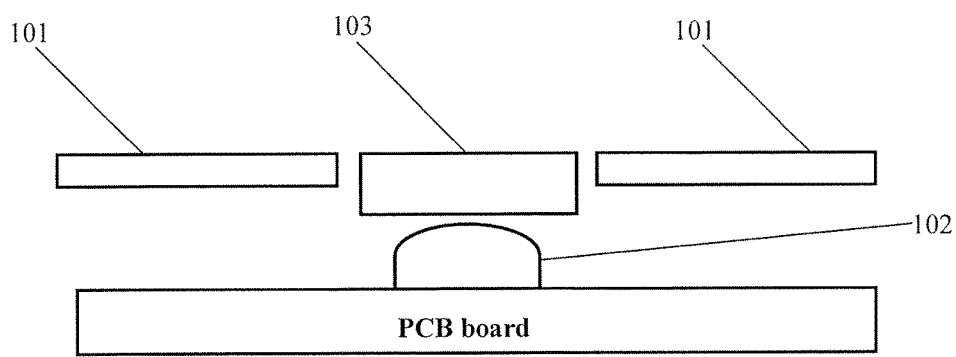
FIG. 1 is a sectional view of a touch button of a terminal device in the related art.
Figure 2:
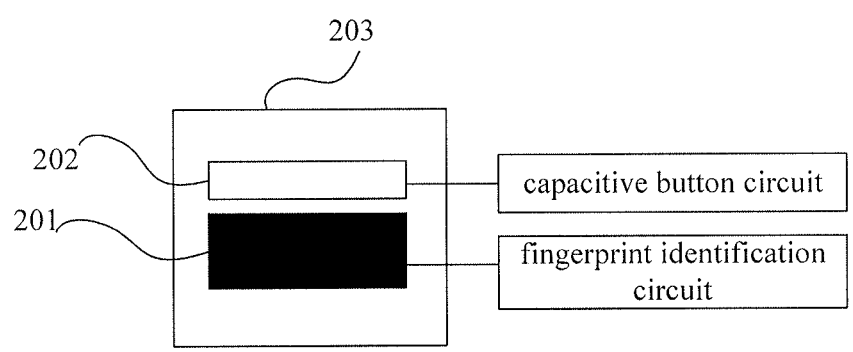
FIG. 2 is a sectional view of an apparatus for realizing a touch button and fingerprint identification, according to an example embodiment.

FIG. 2 is a sectional view of an apparatus 200 for realizing a touch button and fingerprint identification, according to an exemplary embodiment. Referring to FIG. 2, the apparatus 200 includes a fingerprint identification sensor 201 and a capacitive button sensor 202.

The fingerprint identification sensor 201 is disposed below a cover glass 203 of a terminal device.

The capacitive button sensor 202 is disposed below the cover glass 203 and located on at least one side of the fingerprint identification sensor 201.

In exemplary embodiments, the fingerprint identification sensor 201 and the capacitive button sensor 202 are located below a preset touch area of the cover glass 203.

Figure 3:
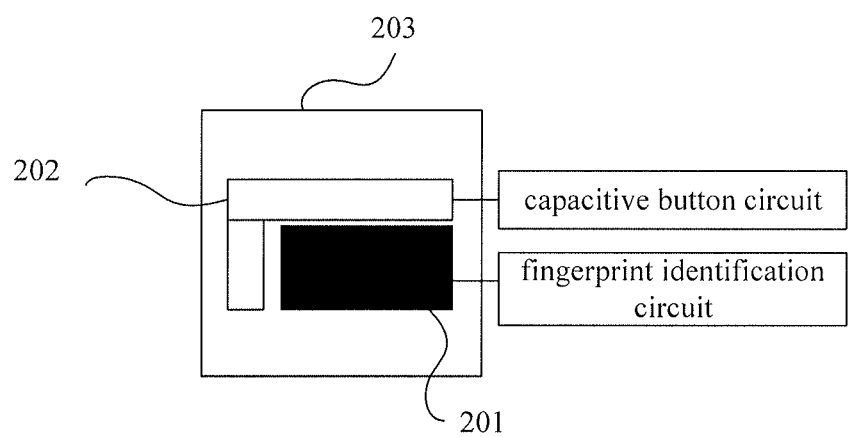
FIG. 3 is a sectional view of an apparatus for realizing a touch button and fingerprint identification, according to an example embodiment.
Figure 4:
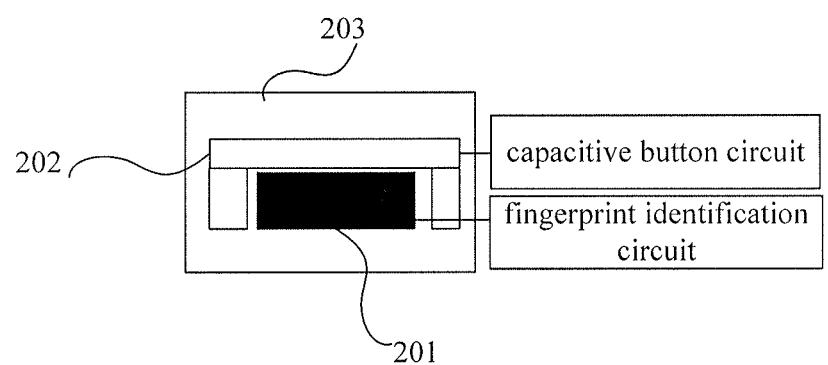
FIG. 4 is a sectional view of an apparatus for realizing a touch button and fingerprint identification, according to an example embodiment.
Figure 5:
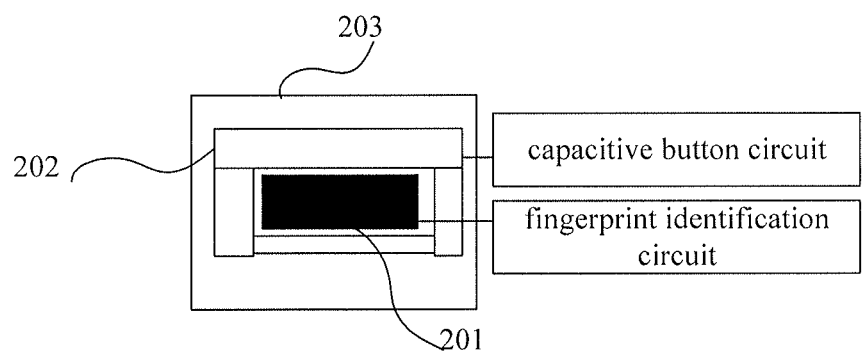
FIG. 5 is a sectional view of an apparatus for realizing a touch button and fingerprint identification, according to an example embodiment.

In exemplary embodiments, the capacitive button sensor 202 is located on any one or more sides of the fingerprint identification sensor 201; or the capacitive button sensor 202 surrounds the fingerprint identification sensor 201. In order to improve the effect of the integration of the fingerprint identification sensor 201 and the capacitive button sensor 202, and to cover both at least part of the capacitive button sensor 202 and at least part of the fingerprint identification sensor 201 below the preset touch area when a user's finger touches and presses the preset touch area of the cover glass 203, the capacitive button sensor 202 and the fingerprint identification sensor 201 can be disposed in a compact way. For example, the capacitive button sensor 202 is disposed close to the fingerprint identification sensor 201. Also for example, the capacitive button sensor 202 is disposed at two or more sides of the fingerprint identification sensor 201 or surrounding the fingerprint identification sensor 201, as shown in FIGS. 3, 4 and 5. In FIG. 3, the capacitive button sensor 202 is disposed on two sides of the fingerprint identification sensor 201. In FIG. 4, the capacitive button sensor 202 is disposed on three sides of the fingerprint identification sensor 201. In FIG. 5, the capacitive button sensor 202 is disposed to surround the fingerprint identification sensor 201. Therefore, the effect of the integration of the fingerprint identification sensor 201 and the capacitive button sensor 202 is improved.

Referring to FIGS. 2-5, the fingerprint identification sensor 201 is configured to collect fingerprint information applied to the cover glass 203. The capacitive button sensor 202 is configured to collect button information applied to the cover glass 203. For example, when a finger of the user touches a metal layer of the capacitive button sensor 202, coupling capacitance may be formed between the user and a surface of a touch screen including the cover glass 203 due to an electric field of the human body. For a high frequency current, the capacitance is a direct conductor. Therefore, a small current at a high frequency can flow to the finger of the user at the touch point. This small current may include currents flowing from electrodes at, e.g., four corners of the touch screen respectively, and amplitudes of the currents flowing from the electrodes are respectively proportional to the distances from the touch point to the four corners. The terminal device calculates ratios of the currents to obtain a location of the touch point. In this way, the apparatus 200 can realize a touch button without using a physical button.

In exemplary embodiments, when the user touches and presses the preset touch area of the cover glass 203 with a finger, the fingerprint identification sensor 201 may collect fingerprint information applied to the surface of the cover glass 203 and send the fingerprint information to a fingerprint identification circuit. The fingerprint identification circuit may analyze and process the fingerprint information collected by the fingerprint identification sensor 201 to obtain the fingerprint analysis results, such as fingerprint texture, fingerprint spacing, and other fingerprint characteristic information. Meanwhile, the capacitive button sensor 202 may collect button information applied to the surface of the cover glass 203 and send the button information to a capacitive button circuit. The capacitive button circuit may analyze and process the button information collected by the capacitive button sensor 202 to obtain the user's touch operation. A processor of the terminal device may further perform an identity authentication according to the touch operation and the fingerprint analysis results. For example, the fingerprint analysis results obtained by the fingerprint identification circuit may be compared with pre-stored fingerprint data to determine an identity of the current user.

A terminal device is also provided in embodiments of the present disclosure. The terminal device includes a touch screen and the apparatus 200 for realizing a touch button and fingerprint identification described above.

With the apparatus 200 for realizing a touch button and fingerprint identification, the user can touch and press the preset touch area of the cover glass using a finger with any strength, and both the touch button information and the fingerprint information may be obtained by the apparatus 200. In this way, for example, the current user's identity may be identified. In addition, the fingerprint identification function and the touch button function are integrated, so as to realize a compatibility mode, thereby not only enhancing the aesthetic appearance of the terminal device but also improving a structural strength of the cover glass. Moreover, the user can perform touch and press operations on the cover glass with any strength, which is convenient for the user to operate.

Figure 6:
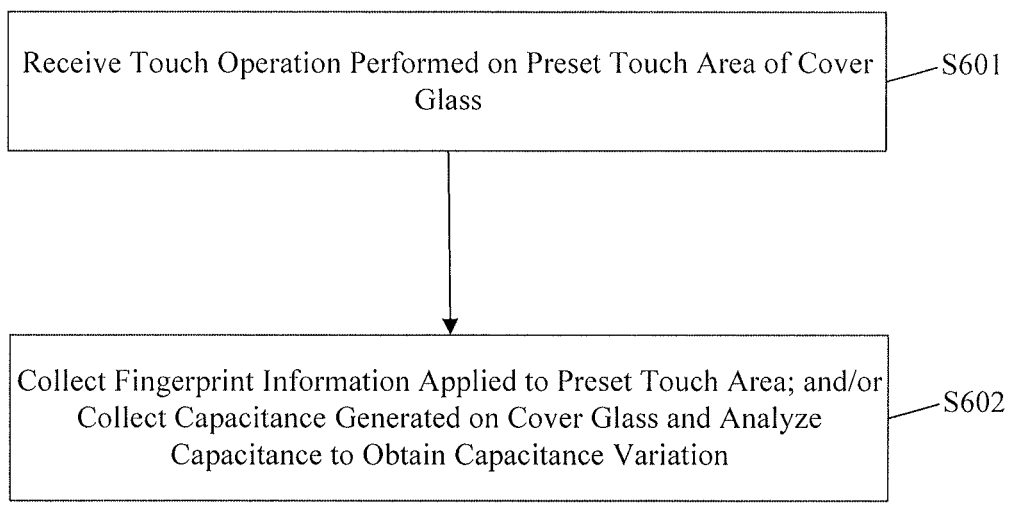
FIG. 6 is a flow chart of a method for realizing a touch button and fingerprint identification, according to an example embodiment.

FIG. 6 is a flow chart of a method 600 for realizing a touch button and fingerprint identification, according to an exemplary embodiment. For example, the method 600 is used in a terminal device with a fingerprint identification function. Referring to FIG. 6, the method 600 includes following steps S601-S602.

In step S601, a touch operation performed on a preset touch area of a cover glass is received, similar to the above description in connection with the apparatus 200 (FIGS. 2-5).

In step S602, fingerprint information applied to the preset touch area is collected; and/or a capacitance generated on the cover glass is collected and the capacitance is analyzed to obtain a capacitance variation. After obtaining the capacitance variation, button information may be obtained according to the capacitance variation.

Figure 7:
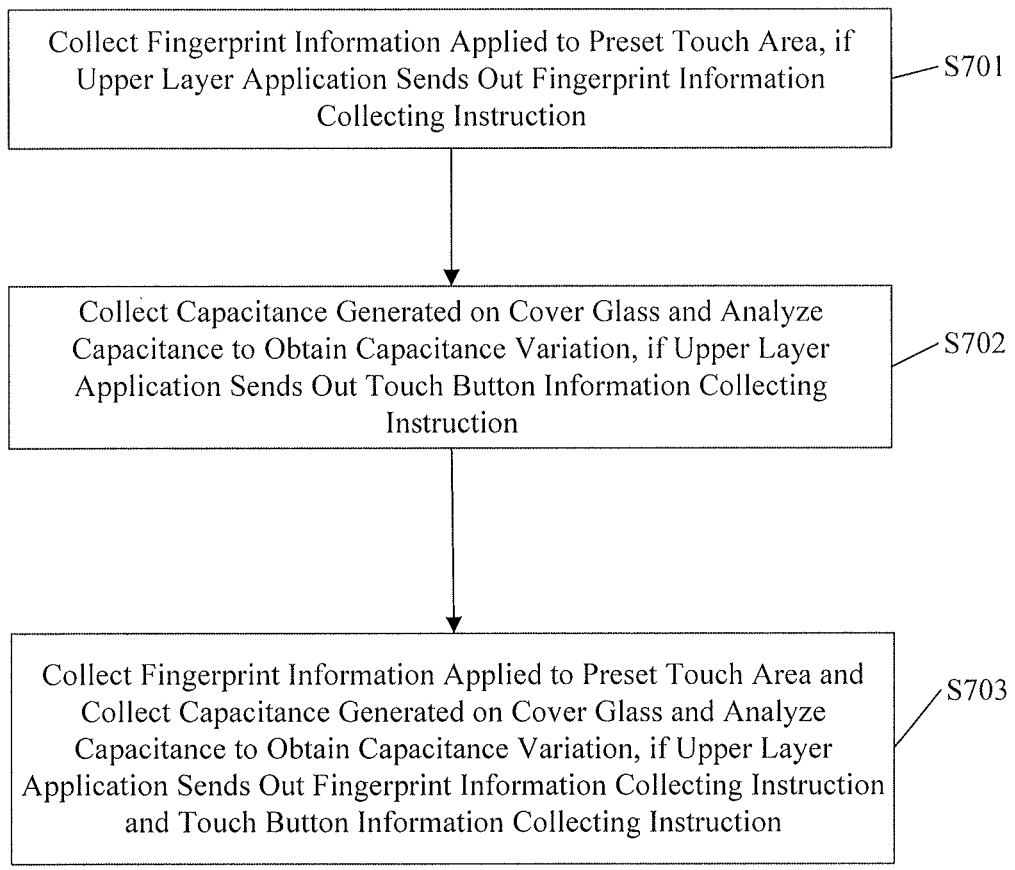
FIG. 7 is a flow chart illustrating a step in a method for realizing a touch button and fingerprint identification, according to an example embodiment.

FIG. 7 is a flow chart illustrating step S602 (FIG. 6), according to an exemplary embodiment. Referring to FIG. 7, step S602 may be implemented by steps S701-S703.

In step S701, the fingerprint information applied to the preset touch area is collected, if an upper layer application sends out a fingerprint information collecting instruction. For example, the upper layer application may be software configured for user interaction.

In step S702, the capacitance generated on the cover glass is collected and the capacitance is analyzed to obtain the capacitance variation, if the upper layer application sends out a button information collecting instruction.

In step S703, the fingerprint information applied to the preset touch area is collected, and the capacitance generated on the cover glass is collected and the capacitance is analyzed to obtain the capacitance variation, if the upper layer application sends out the fingerprint information collecting instruction and the button information collecting instruction.

In the method described above, when the user touches the preset touch area, the fingerprint information and the button information may be collected according to the collecting instructions of the upper layer application, without interfering with each other.

Figure 8:
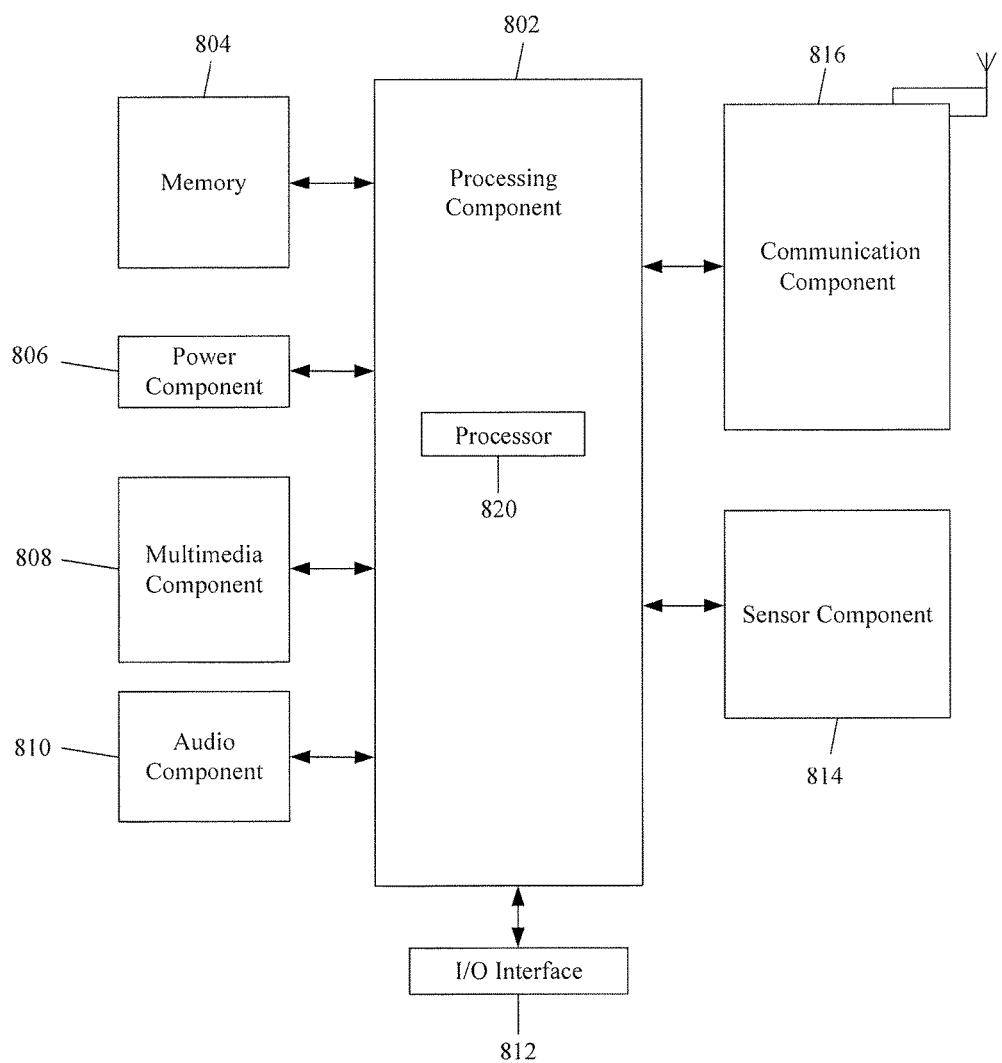
FIG. 8 is a block diagram of a device for realizing a touch button and fingerprint identification, according to an example embodiment.

FIG. 8 is a block diagram of a device 800 for realizing a touch button and fingerprint identification, according to an exemplary embodiment. For example, the device 800 may be a mobile phone, a computer, a digital broadcast terminal, a messaging device, a gaming console, a tablet, a medical device, exercise equipment, a personal digital assistant, and the like.

Referring to FIG. 8, the device 800 may include one or more of the following components: a processing component 802, a memory 804, a power component 806, a multimedia component 808, an audio component 810, an input/output (I/O) interface 812, a sensor component 814, and a communication component 816.

The processing component 802 typically controls overall operations of the device 800, such as the operations associated with display, telephone calls, data communications, camera operations, and recording operations. The processing component 802 may include one or more processors 820 to execute instructions so as to perform all or a part of the steps in the above described methods. Moreover, the processing component 802 may include one or more modules which facilitate the interaction between the processing component 802 and other components. For instance, the processing component 802 may include a multimedia module to facilitate the interaction between the multimedia component 808 and the processing component 802.

The memory 804 is configured to store various types of data to support the operation of the device 800. Examples of such data include instructions for any applications or methods operated on the device 800, contact data, phonebook data, messages, pictures, videos, etc. The memory 804 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 806 is configured to provide power to various components of the device 800. The power component 806 may include a power management system, one or more power sources, and other components associated with the generation, control, and distribution of power in the device 800.

The multimedia component 808 includes a screen configured to provide an output interface between the device 800 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 808 includes a front camera and/or a rear camera. The front camera and the rear camera may receive an external multimedia datum when the device 800 is in an operation mode such as a photographing mode or a video mode. Each of the front camera and the rear camera may be a fixed optical lens system or have focus and optical zoom capability.

The audio component 810 is configured to output and/or input audio signals. For example, the audio component 810 includes a microphone configured to receive an external audio signal when the device 800 is in an operation mode, such as a call mode, a recording mode, and a voice recognition mode. The received audio signal may be further stored in the memory 804 or transmitted via the communication component 816. In some embodiments, the audio component 810 further includes a loud speaker to output audio signals.

The I/O interface 812 is configured to provide an interface between the processing component 802 and peripheral interface modules, such as a keyboard, a click wheel, buttons, and the like. The buttons may include, but are not limited to, a home button, a volume button, a starting button, and a locking button.

The sensor component 814 includes one or more sensors to provide status assessments of various aspects of the device 800. For instance, the sensor component 814 may detect an on/off status of the device 800, relative positioning of components (e.g., a display screen and a keypad) of the device 800. The sensor component 814 may further detect a change in position of the device 800 or a component of the device 800, a presence or absence of user contact with the device 800, an orientation or an acceleration/deceleration of the device 800, and a change in temperature of the device 800. The sensor component 814 may include a proximity sensor configured to detect the presence of nearby objects without any physical contact. The sensor component 814 may further include a light sensor, such as a CMOS or CCD image sensor, for use in imaging applications. In some embodiments, the sensor component 814 may also include an accelerometer sensor, a gyroscope sensor, a magnetic sensor, a pressure sensor, or a temperature sensor.

The communication component 816 is configured to facilitate a wired or wireless communication between the device 800 and other devices. The device 800 can access a wireless network based on a communication standard, such as WiFi, 2G, or 3G, or a combination thereof. In one example embodiment, the communication component 816 receives a broadcast signal or broadcast associated information from an external broadcast control system via a broadcast channel. In one example embodiment, the communication component 816 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, or other technologies.

In example embodiments, the device 800 may be implemented with one or more electronic elements such as application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In example embodiments, there is further provided a non-transitory computer readable storage medium including instructions, such as included in the memory 804, executable by the processor 820 in the device 800 to perform the above-described methods. For example, the non-transitory computer-readable storage medium may be a ROM, a RAM, a CD-ROM, a magnetic tape, a floppy disc, an optical data storage device, and the like.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as example only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. An apparatus for realizing a touch button and fingerprint identification, comprising:
a fingerprint identification sensor, disposed below a cover glass of a touch screen of a terminal device, the fingerprint identification sensor being positioned at a fixed location and being configured to collect fingerprint information applied to the cover glass; and
a capacitive button sensor disposed below the cover glass, the capacitive button sensor being configured to collect button information applied to the cover glass by collecting a capacitance generated on the cover glass and analyzing the capacitance to obtain a capacitance variation, wherein the capacitance generated on the cover glass causes currents flowing through four electrodes at four corners of the touch screen, the currents flowing through the four electrodes being proportional to respective distances from a finger to the four corners, such that a location of a touch point is obtained by calculating ratios of the currents,
wherein the capacitive button sensor is disposed close to the fingerprint identification sensor in a compact way without overlapping the fingerprint identification sensor, and the capacitive button sensor is located on one or more sides of the fingerprint identification sensor or surrounds the fingerprint identification sensor, and
wherein when a soft touch is applied to a preset touch area of the cover glass, the preset touch area covering at least a portion of the fingerprint identification sensor and at least a portion of the capacitive button sensor below the preset touch area, the fingerprint identification sensor and the capacitive button sensor simultaneously collect the fingerprint information and the button information.

2. The apparatus according to claim 1, wherein:
both the fingerprint identification sensor and the capacitive button sensor are located below the preset touch area of the cover glass.

3. A terminal device, comprising:
a touch screen including a cover glass; and
an apparatus for realizing a touch button and fingerprint identification, wherein the apparatus includes:
a fingerprint identification sensor, disposed below the cover glass, the fingerprint identification sensor being positioned at a fixed location and being configured to collect fingerprint information applied to the cover glass; and
a capacitive button sensor disposed below the cover glass, the capacitive button sensor being configured to collect button information applied to the cover glass by collecting a capacitance generated on the cover glass and analyzing the capacitance to obtain a capacitance variation, wherein the capacitance generated on the cover glass causes currents flowing through four electrodes at four corners of the touch screen, the currents flowing through the four electrodes being proportional to respective distances from a finger to the four corners, such that a location of a touch point is obtained by calculating ratios of the currents,
wherein the capacitive button sensor is disposed close to the fingerprint identification sensor in a compact way without overlapping the fingerprint identification sensor, and the capacitive button sensor is located on one or more sides of the fingerprint identification sensor or surrounds the fingerprint identification sensor, and
wherein when a soft touch is applied to a preset touch area of the cover glass, the preset touch area covering at least a portion of the fingerprint identification sensor and at least a portion of the capacitive button sensor below the preset touch area, the fingerprint identification sensor and the capacitive button sensor simultaneously collect the fingerprint information and the button information.

4. The terminal device according to claim 3, wherein both the fingerprint identification sensor and the capacitive button sensor are located below the preset touch area of the cover glass.

5. A method for realizing a touch button and fingerprint identification, comprising:
receiving a soft touch operation performed on a preset touch area of a cover glass of a touch screen, the preset touch area covering at least a portion of a fingerprint identification sensor and at least a portion of a capacitive button sensor disposed below the preset touch area, wherein the fingerprint identification sensor is positioned at a fixed location and is configured to collect fingerprint information applied to the cover glass, the capacitive button sensor is disposed close to the fingerprint identification sensor in a compact way without overlapping the fingerprint identification sensor, and the capacitive button sensor is located on one or more sides of the fingerprint identification sensor or surrounds the fingerprint identification sensor;
collecting, by the fingerprint identification sensor disposed below the cover glass, fingerprint information applied to the preset touch area; and
collecting, by the capacitive button sensor disposed below the cover glass, a capacitance generated on the cover glass and analyzing the capacitance to obtain a capacitance variation, to collect button information applied to the cover glass, wherein the capacitance generated on the cover glass causes currents flowing through four electrodes at four corners of the touch screen, the currents flowing through the four electrodes being proportional to respective distances from a finger to the four corners, such that a location of a touch point is obtained by calculating ratios of the currents,
wherein the collecting by the fingerprint identification sensor and the collecting by the capacitive button sensor are performed simultaneously.

6. The method according to claim 5, wherein the performing comprises:
collecting the fingerprint information applied to the preset touch area, if an upper layer application sends out a fingerprint information collecting instruction;
collecting the capacitance generated on the cover glass and analyzing the capacitance to obtain the capacitance variation, if the upper layer application sends out a button information collecting instruction; and
collecting the fingerprint information applied to the preset touch area, and simultaneously collecting the capacitance generated on the cover glass and analyzing the capacitance to obtain the capacitance variation, if the upper layer application sends out the fingerprint information collecting instruction and the button information collecting instruction.

* * * * *